US012069388B2

(12) United States Patent
Bamji

(10) Patent No.: US 12,069,388 B2
(45) Date of Patent: Aug. 20, 2024

(54) REPEATED NONDESTRUCTIVE PHOTODETECTOR READOUT ASSESSMENTS

(71) Applicant: Microsoft Technology Licensing, LLC, Redmond, WA (US)

(72) Inventor: Cyrus Soli Bamji, Fremont, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 61 days.

(21) Appl. No.: 17/809,474

(22) Filed: Jun. 28, 2022

(65) Prior Publication Data

US 2023/0421920 A1   Dec. 28, 2023

(51) Int. Cl.
*H04N 25/75*      (2023.01)
*H01L 27/146*     (2006.01)
*H04N 25/65*      (2023.01)
*H04N 25/778*     (2023.01)

(52) U.S. Cl.
CPC ....... *H04N 25/75* (2023.01); *H01L 27/14612* (2013.01); *H01L 27/14643* (2013.01); *H04N 25/65* (2023.01); *H04N 25/778* (2023.01)

(58) Field of Classification Search
CPC ...... H04N 25/75; H04N 25/65; H04N 25/778; H01L 27/14612; H01L 27/14643
See application file for complete search history.

(56) References Cited

U.S. PATENT DOCUMENTS

| 2009/0219058 | A1  | 9/2009  | Ohba |
| 2016/0093664 | A1* | 3/2016  | Solhusvik ............ H04N 25/771 |
|              |     |         | 257/229 |
| 2016/0344965 | A1* | 11/2016 | Grauer .................. H04N 25/135 |
| 2017/0208272 | A1* | 7/2017  | Guidash .............. H01L 27/1461 |
| 2020/0021768 | A1* | 1/2020  | Lin ....................... G01N 21/554 |
| 2020/0036918 | A1* | 1/2020  | Ingle ................. H01L 27/14625 |

FOREIGN PATENT DOCUMENTS

| EP | 2271077 A1 | 1/2011 |
| EP | 3001458 A1 | 3/2016 |

OTHER PUBLICATIONS

"International Search Report and Written Opinion Issued in PCT Application No. PCT/US2023/011448", Mailed Date: Mar. 23, 2023, 14 Pages.

* cited by examiner

*Primary Examiner* — Padma Haliyur
(74) *Attorney, Agent, or Firm* — Alleman Hall & Tuttle LLP

(57) ABSTRACT

An image sensor is disclosed. The image sensor includes a photo detector and a readout structure electronically coupled to the photodetector. The photodetector is configured to accumulate one or more photo charges responsive to one or more incident photons during an integration period. The readout structure is configured to repeatedly and nondestructively assess an amount of minority carrier photo charges accumulated at the photodetector during the integration period.

15 Claims, 10 Drawing Sheets

$\Delta V_{BLK1} = \Delta Q \; (C_{BLK1} + (C_{OX1} \perp C_{SF1}))$ ●

$\Delta V_{VSF1} = \Delta Q \; (C_{BLK1} + (C_{OX1} \perp C_{SF1}))*(C_{OX1}/(C_{SF1} + C_{OX1}))$ ◊

$\Delta V_{BITLINE} = 2*\Delta Q \; (C_{BLK1} + (C_{OX1} \perp C_{SF1}))*(C_{OX1}/(C_{SF1} + C_{OX1}))$ ■

● : TOP OF PLATE OF $C_{BLK1}$
◊ : GATE OF $T_{SF1}$
■ : $(V^0_{BITLINE1} - V_{BITLINE2}) - (V_{BITLINE1} - V^0_{BITLINE2})$

REPEATED NONDESTRUCTIVE PHOTODETECTOR READOUT ASSESSMENTS

BACKGROUND

Over the last 20 years, digital-imaging technology has evolved at a remarkable pace. High-resolution, high-speed, high-sensitivity digital-image sensors are now available at low cost. Such sensors are found in color cameras, for example, and in a range of electronic devices targeting the consumer market. Significantly, digital image sensing is not limited to color-camera implementations but may be used for infrared depth-vision and night-vision as well.

SUMMARY

An image sensor is disclosed. The image sensor includes a photodetector and a readout structure electronically coupled to the photodetector. The photodetector is configured to accumulate one or more minority carrier photo charges responsive to one or more incident photons during an integration period. The readout structure is configured to repeatedly and nondestructively assess an amount of minority carrier photo charges accumulated at the photodetector during the integration period.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
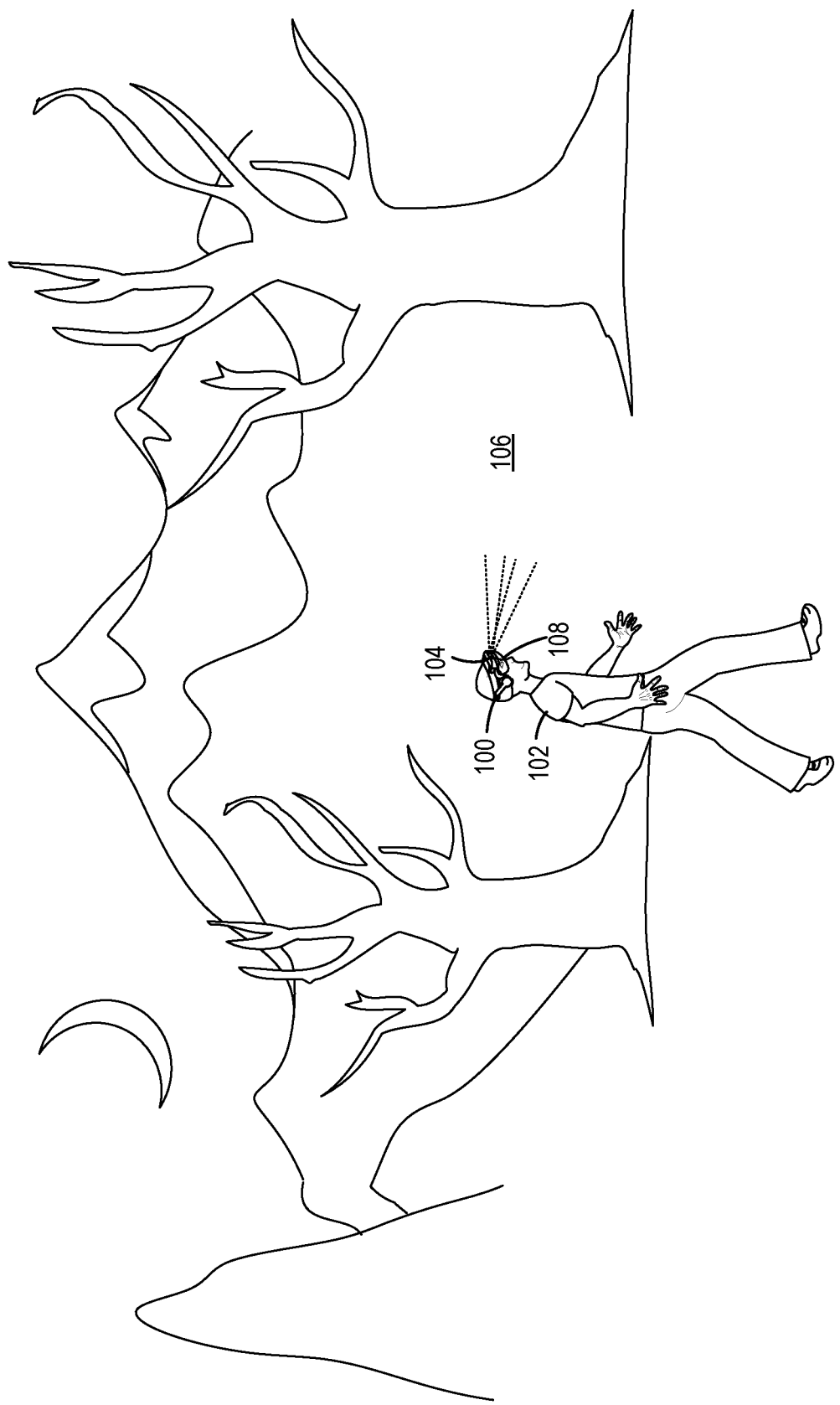
FIG. 1 shows an example low light visualization device worn by a user.

Detecting low light with an image sensor is advantageous in many applications. For example, an image sensor of a low light visualization device detects very low light in order to provide night vision functionality. Low light detection with ultra-low read noise is desirable. Otherwise, the fidelity of the low-light image is reduced. For example, such a low-fidelity low light image can include salting effects (i.e., false positive values for pixels that should be dark) that reduce the image quality of the low light image. Image intensifier tubes ($I^2T$) have been used to provide signal amplification of a photonic signal read out from an image sensor in a manner in which the primary noise generation sources are downstream of the gain of the amplification in order to improve a signal to noise ratio (SNR) of the photonic signal. However, $I^2Ts$ may create various other issues, such as consuming a significant amount of power and adding additional bulk and cost to a low light visualization device.

Complementary metal-oxide-semiconductor (CMOS) image sensor technology is now refined to a level where high-resolution, down to single-photon detection is within reach with a standard CMOS image sensor architecture. Standing in the way of that achievement are noise sources that corrupt the image signal. One type of noise that affects operation of a CMOS image sensor is KT/C noise. KT/C noise is a thermal noise that is added to a signal when the signal is sampled on a capacitor.

One way to cancel KT/C noise is by performing a double correlated sampling (DCS) technique to measure a voltage change due to charges collected by a photodetector in a CMOS pixel. According to the DCS technique, photo charges generated from a photonic signal are stored and accumulated as minority carriers. A floating diffusion node is initialized to a reset voltage ($V_{reset}$) that includes KT/C noise. The accumulated photo charges are subsequently transferred to the floating diffusion node to generate an intermediate voltage ($V_{reset+signal}$) which is measured. Then, a signal voltage ($V_{signal}=(V_{reset+signal}-V_{reset})$) is obtained by subtracting the two values, such that the KT/C noise is canceled. However, this destructive DCS-based measurement can only be performed once as the operation of transferring the photo charges onto the floating diffusion node and converting the photo charges to a voltage is irreversible. Such a single DCS-based measurement produces an output signal having a relatively low SNR that results in creation of a low-fidelity low light image.

Accordingly, this disclosure is directed to an approach for repeatedly and nondestructively assessing an amount of minority carrier photo charges accumulated at a photodetector of a pixel during an integration period, whereby signal accumulates faster than noise at each assessment iteration to increase SNR of the signal. Such an approach can produce CMOS pixel read noise levels that compete with noise levels of $I^2Ts$, and thus enable a low light visualization device (and/or other imaging devices) to produce high fidelity low light images without the use of $I^2Ts$. In other words, the repeated and nondestructive signal assessment approach provides the technical benefit of lower power consumption and reduced bulk and cost.

FIG. 1 shows aspects of an example low light visualization device 100 worn by a user 102. The low light visualization device 100 includes an outward-facing low light camera 104 configured to image a real-world physical scene 106. The low light visualization device 100 further includes a near-eye display 108 configured to visually present low light images of the real-world physical scene 106 captured by the low light camera 104. In some implementations, the low light visualization device 100 may include a mixed reality device with low light visualization capabilities. The low light camera 104 includes an image sensor including a plurality of CMOS pixels. The low light camera 104 is configured to, for each of the plurality of CMOS pixels, repeatedly and nondestructively assess an amount (e.g., exact quantity or relative amount) of minority carrier photo charges accumulated at a photodetector of the CMOS pixel during an integration period, whereby SNR increases faster than noise for each assessment iteration. This low light camera 104 performs a plurality of assessment iterations to produce high SNR readout signals of the CMOS pixels that result in high-fidelity low light images that are visually presented via the near-eye display 108. In this manner, the low light visualization device 100 provides clear high quality night vision capability to the user 102 with minimal salting effects.

The low light visualization device 100 is provided as a non-limiting example of a device that employs a low light camera configured to perform repeated and nondestructive DCS-based measurements of CMOS pixels. These concepts are broadly applicable to other camera configurations without departing from the scope of the present disclosure. For example, these concepts are applicable to other non-CMOS based camera configurations.

Figure 2:
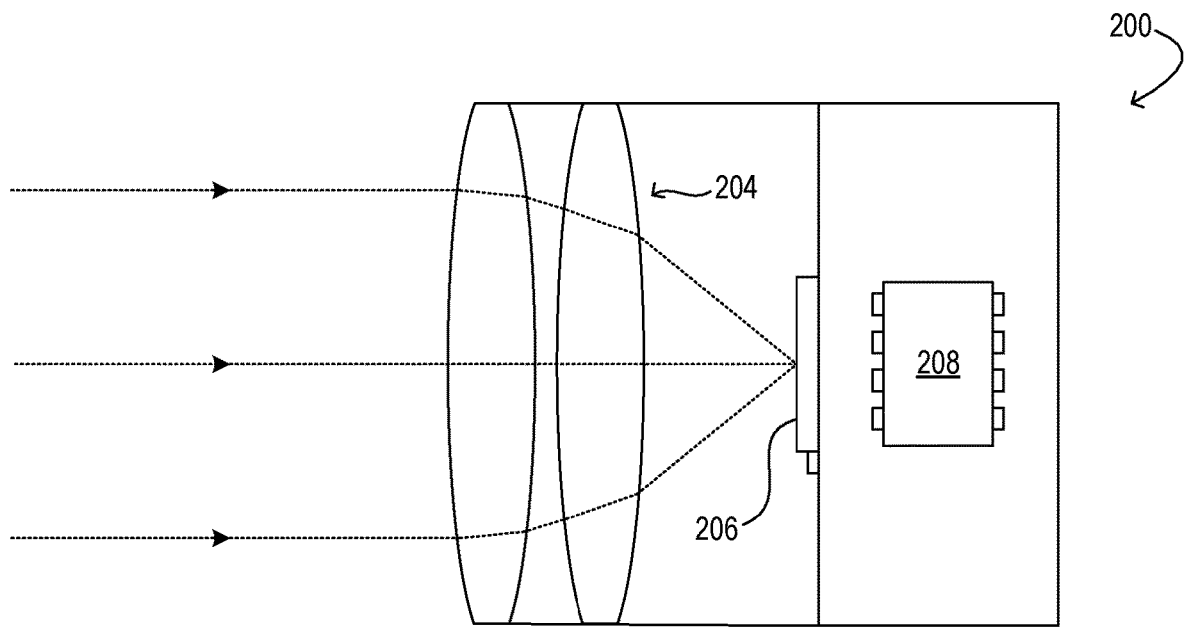
FIG. 2 shows an example camera that may be implemented in a low light visualization device.

FIG. 2 shows aspects of an example camera 200 configured to acquire an optical image of a scene. For example, the camera 200 may correspond to the low light camera 104 of the low light visualization device 100 shown in FIG. 1. The camera 200 may comprise any suitable type of camera including, but not limited to a color camera, a monochrome camera, a hyperspectral (ultraviolet, infrared, or near-infrared) camera, and/or a depth camera. In some examples, the camera 200 may be configured to acquire, in rapid succession, a time-resolved sequence of images of the scene—i.e., video. The camera 200 may be a stand-alone camera device or a component of a multi-use electronic device. Such multi-use electronic devices are not particularly limited but may include low light visualization devices, smartphones, tablet computers, laptop computers, and virtual- or augmented reality systems, for example.

The camera 200 includes an objective lens system 204 configured to focus an optical image of the scene onto an image sensor 206. The image sensor 206 is an integrated circuit (IC), such as a CMOS IC. The image sensor 206 is coupled operatively to a controller 208, which may be an onboard or networked computer of camera 200 or of the electronic device in which the camera is installed. In some examples, the controller 208 may include a processor and associated computer memory. In some examples, the controller 208 may include a system-on-a-chip (SoC), application specific integrated circuit (ASIC), or the like.

At low light intensity, the image sensor 206 is prone to KT/C noise that poses a significant barrier to using CMOS image sensors for down to single-photon detection. Down to single-photon detection is believed to be the appropriate operating goal for very low-light photography and videography, such as night vision. As noted above and described in further detail below, the disclosed approach is performed to increase the SNR of the readout signals of the CMOS pixels of the image sensor.

Figure 3:
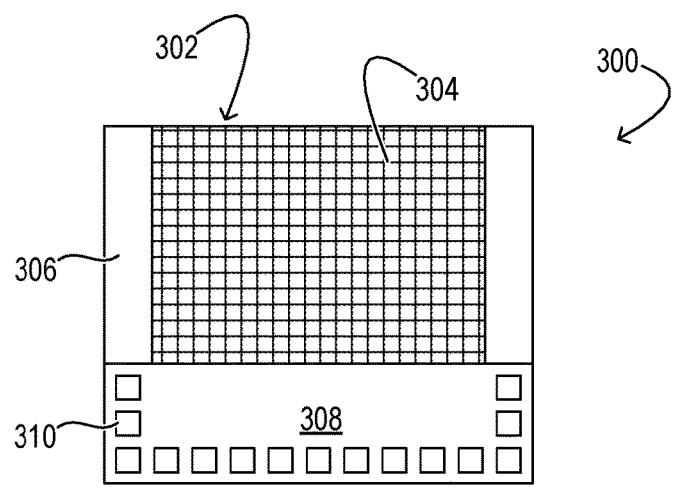
FIG. 3 shows an example image sensor of the camera shown in FIG. 2.

FIG. 3 schematically shows aspects of an example image sensor 300. For example, the image sensor 300 may correspond to the image sensor 206 shown in FIG. 2. The image sensor 300 includes sensor array 302—a rectangular array of CMOS pixels each responsive to incident photon flux. The overall size and resolution of the image sensor may be selected for any desired application. In one non-limiting example, each CMOS pixel can be about 6 micrometers (μm) in width. The sensor array 302 may include 2000-3000 horizontal rows and 1000-2000 vertical columns of CMOS pixels 304. The image sensor 300 also includes at least one row driver 306 and at least one column readout structure 308. The row driver 306 is a low-power circuit element configured to select the row of sensor array 302 to be read in the current readout operation. Coupled electronically to the sensor array, readout structure 308 is configured to release an electronic signal that is based on the incident photon flux received by the sensor elements of the selected row. In other words, the electronic signal varies in dependence on the incident photon flux such that the magnitude of the signal reliably and predictably indicates the corresponding magnitude of photon flux on which the electronic signal is based. To that end, the column readout structure 308 may be configured to amplify and digitize the charge sensed along each column of the sensor array 302. The column readout structure 308 may include both analog and digital componentry—e.g., transconductance amplifiers and/or analog-to-digital converters. In some examples, the column readout structure 308 may include application-specific integrated-circuit (ASIC) componentry and may be referred to as an 'ASIC.' In the illustrated example, a plurality of bonding pads 310 are arranged around the column readout structure 308 and coupled ohmically to the readout structure 308. The bonding pads 310 enable image sensor 300 to be addressed by a controller (e.g., the controller 208 shown in FIG. 2).

Figure 4:
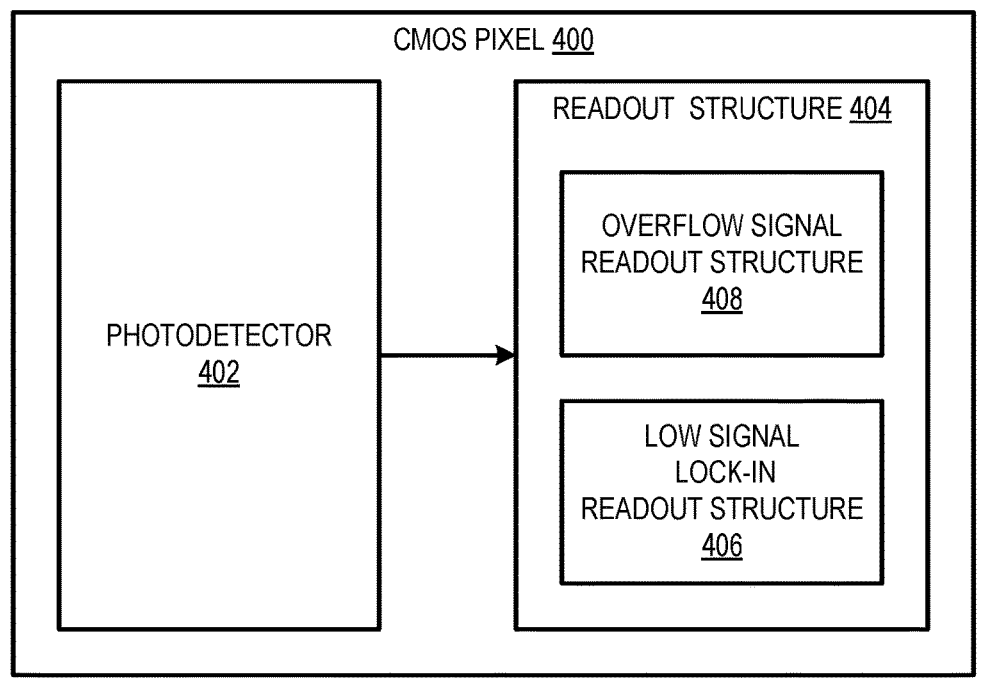
FIG. 4 shows an example pixel of the image sensor shown in FIG. 3.

FIG. 4 schematically shows an example CMOS pixel 400 configured to perform down to single-photon detection for low light scenarios. For example, the CMOS pixel 400 may correspond to any of the CMOS pixels 304 of the image sensor 300 shown in FIG. 3. The CMOS pixel 400 includes a photodetector 402 configured to accumulate one or more minority carrier photo charges responsive to one or more incident photons during an integration period of the image sensor. In some implementations, the photodetector 402 includes a pinned photodetector having low lag, low noise, high quantum efficiency, and low dark current.

A readout structure 404 includes a low signal lock-in readout structure 406 and an overflow signal readout structure 408. The low signal lock-in readout structure 406 is configured to have suitable sensitivity to accurately detect low magnitude readout signals (e.g., down to single photon detection) accumulated in the photodetector 402. In scenarios where the readout signal is greater than a threshold capacity of the low signal lock-in readout structure 406, the readout signal is divided into two components—a small signal that is accurately read by the low signal lock-in readout structure 406, and an overflow signal that is read by the overflow signal readout structure 408. The overflow signal readout structure 408 may be less precise than the low signal lock-in readout structure 406, but the overflow signal is big enough that the magnitude of the overflow signal overcomes the noisier measurement performed by the overflow signal readout structure 408 and thus still maintains a suitable SNR.

This disclosure focuses on operation of the low signal lock-in readout structure 406 to repeatedly and nondestructively assess an amount of minority carrier photo charges accumulated on the photodetector 402 during an integration period, whereby SNR improves because signal accumulates faster than noise at each assessment iteration.

Figure 5:
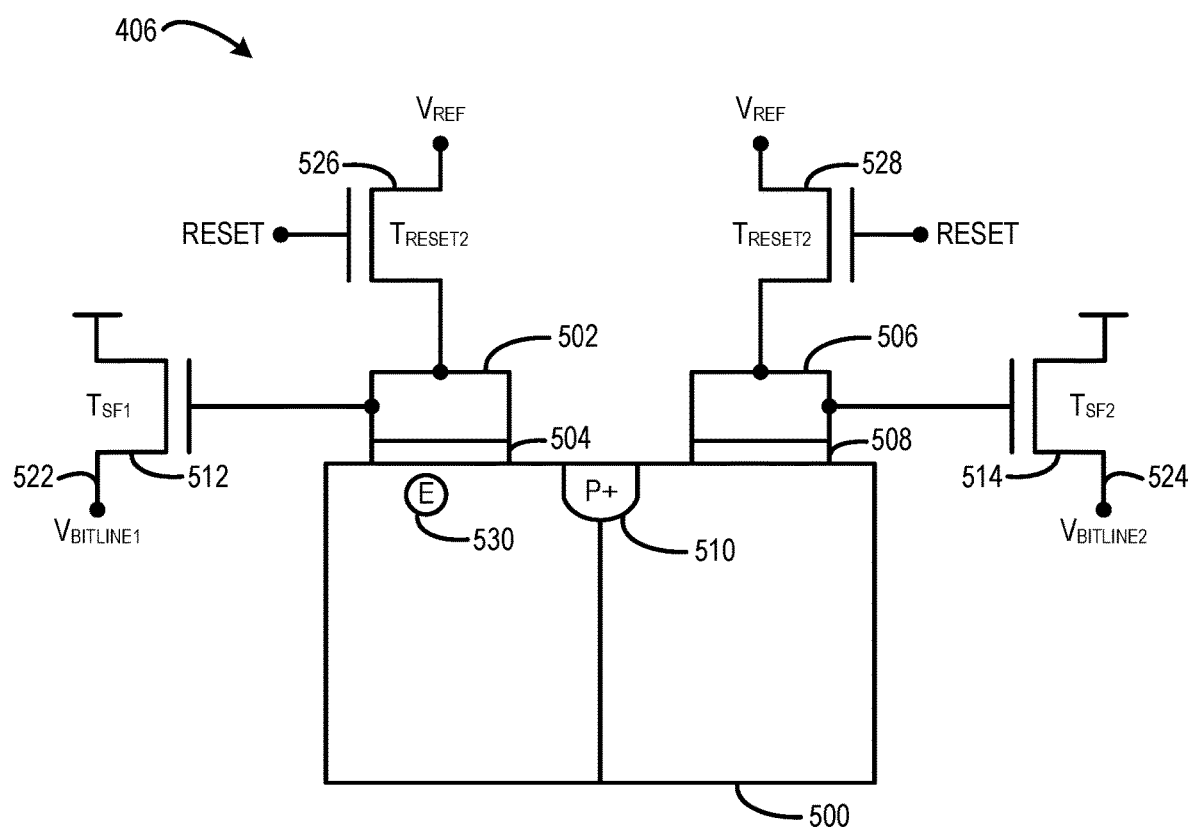
FIG. 5 shows an example readout structure of the pixel shown in FIG. 4.

FIG. 5 shows aspects of the low signal lock-in readout structure 406 of the CMOS pixel 400 shown in FIG. 4. The low signal lock-in readout structure 406 is shown in simplified form including relevant electronic components. The low signal lock-in readout structure 406 will be referred to hereinbelow as the readout structure 406. The readout structure 406 includes a silicon substrate 500. A first gate 502 is formed on a first layer of thin gate oxide 504 on top of the silicon substrate 500. A second gate 506 is formed on a second layer of thin gate oxide 508 on the silicon substrate 500. The two gates 502 and 506 are separated by an electrical barrier 510. The electrical barrier 510 is configured to inhibit electrical charge accumulated on one gate to switch to the other gate under certain operating conditions. In the illustrated example, the electrical barrier 510 includes a P+ implant embedded in the silicon substrate 500. In other examples, the electrical barrier 510 may be formed in a different manner.

The readout structure 406 includes a first source follower 512 electronically coupled to the first gate 502 and a second source follower 514 electronically coupled to the second gate 506. In the illustrated example, the source followers 512 and 514 are used to read out voltages on the gates ($V_{bitline1}$, $V_{bitline2}$) via corresponding bitlines 522, 524. The readout structure 406 is configured such that the voltages ($V_{bitline1}$, $V_{bitline2}$) sampled on the gates may indicate an amount of minority carrier photo charges accumulated on the photodetector 402 (shown in FIG. 4) for an integration period. The source followers 512 and 514 provide current and power gain and low output impedance, such that the output does not drop under a load.

The readout structure 406 includes a first reset transistor 526 electronically coupled to the first gate 502 and a second reset transistor 528 electronically coupled to the second gate 506. The readout structure 406 is configured to control the first and second reset transistors 526, 528 to periodically initialize a voltage on each of the two gates to a reset voltage ($V_{reset}$). In particular, when the readout structure 406 turns on the first and second reset transistors 526, 528, the first and second gates 502, 506 are connected to a reference voltage ($V_{REF}$). However, due to the existence of KT/C noise in the readout structure 406, the first and second gates 502, 506 are initialized to the reset voltage ($V_{reset}$) which differs from the reference voltage ($V_{REF}$) by the amount of KT/C noise in the readout structure 406. Note for the reset operation, the reset voltage ($V_{reset}$) of the two gates can be measured on the bitlines 522, 524 of the source followers 512, 514.

Prior to repeatedly and nondestructively assessing the amount of minority carrier photo charges accumulated at the photodetector 402 (shown in FIG. 4) for the integration period, the readout structure 406 is configured to empty any prior charge accumulated under the two gates 502, 506. Note that, in some implementations, the reset voltage ($V_{reset}$) of the two gates 502, 506 preferably can be measured on the bitlines 522, 524 of the source followers 512, 514 after prior charge is emptied from below the two gates 502, 506. In other implementations, the reset voltage ($V_{reset}$) of the two gates 502, 506 can be measured before charge is emptied from the two gates 502, 506. Once emptied of charge, all photo charges accumulated in the photodetector 402 for the integration period are transferred to the readout structure 406 as minority carriers 530. In the illustrated example, the minority carrier photo charges 530 are stored under the first gate 508.

The readout structure 406 is configured to perform a plurality of nondestructive assessments of an amount of accumulated minority carrier photo charges 530 by repeatedly measuring voltages (or measuring a difference of voltages—i.e., a differential voltage) on the first gate 502 and the second gate 506 while alternating the minority carrier photo charges 530 between being positioned under the first gate 502 and being positioned under the second gate 506. The readout structure 406 changes the location of the minority carrier photo charges 530 by changing the voltages of the two gates 502, 506 without changing the total charge under the two gates 502, 506.

In some examples, for each assessment iteration of the amount of minority carrier photo charges 530, the minority carrier photo charges 530 are flipped from being positioned under one gate to being positioned under the other gate and then flipped back to their original position, such that the minority carrier photo charges 530 make a "round trip" for each assessment iteration. At each assessment iteration, the SNR of the signal corresponding to the assessed amount of minority carrier photo charges 530 is improved. KT/C noise from the reset of the first gate 502 and the second 506 by the reset transistors 526, 528 is cancelled at each assessment iteration as will be explained in further detail below with reference to FIG. 8.

In other examples, the amount of minority carrier photo charges 530 may be assessed for an assessment iteration after each "one way" trip in which the carrier photo charges 530 are flipped from being positioned under one gate to being positioned under the other gate of the readout structure 406.

Figure 6:
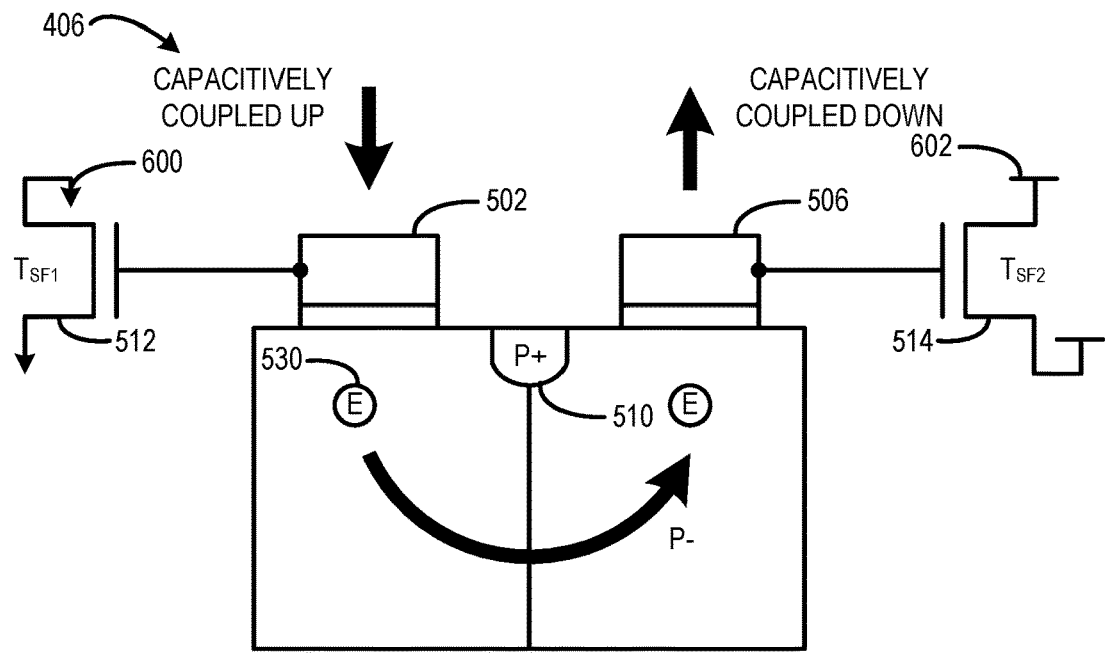
FIG. 6 shows an example implementation in which a nondestructive assessment of an amount of minority carrier photo charges is performed by a readout structure using source followers.

In one example shown in FIG. 6, the readout structure 406 is configured to transfer the minority carrier photo charges 530 from under the first gate 502 to under the second gate 506 by capacitively coupling the first gate 502 to a low reference voltage 600 via the first source follower 512 and capacitively coupling the second gate 506 to a high reference voltage 602 via the second source follower 514. The low reference voltage 600 and the high reference voltage 602 may be set to any suitable voltage levels that create a voltage differential. The low reference voltage 600 on the first gate 502 and the high reference voltage 602 on the second gate 506 repels the minority carrier photo charges 530 from under the first gate 502 and attracts the minority carrier photo charges 530 to under the second gate 506 with a level of attraction suitable to overcome the electrical barrier 510. Once the flipping operation is complete, the readout structure 406 measures the voltages on the first gate 502 and the second 506 with the minority carrier charges 530 positioned under the second gate 506. Voltages of the two gates 502, 506 (sampled via $V_{bitline1}$, $V_{bitline2}$) are sampled while the minority carrier charges 530 are positioned under the first 502 and then again while the minority carrier charges 530 are positioned under the second gate 506 to assess the amount of minority carrier photo charges for an assessment iteration. Note that the operations of moving the minority carrier photo charges is completely reversible and the minority carrier photo charges 530 can be placed back under the previous gate without destructively converting the minority carrier photo charges into majority carriers. Such nondestructive operations allow for repeated assessments of the amount of minority carrier photo charges for a plurality of assessment iterations.

Note that the readout structure 406 preferably disconnects the bitlines 522, 524 of the source followers 512, 514 (shown in FIG. 5) during the transitory period of operation where the minority carrier photo charges 530 are flipped from one gate to the other, so as not to inject noise into the readout voltages ($V_{bitline1}$, $V_{bitline2}$).

In the illustrated example, the source followers 512, 514 are advantageously used as capacitors to control the voltages on the two gates 508, 512 to flip the minority carrier photo charges 530 from being positioned under one gate to being positioned under the other gate. Such a configuration negates the need for additional capacitors to control flipping of the minority carrier photo charges 530 between the two gates 502, 506.

Figure 7:
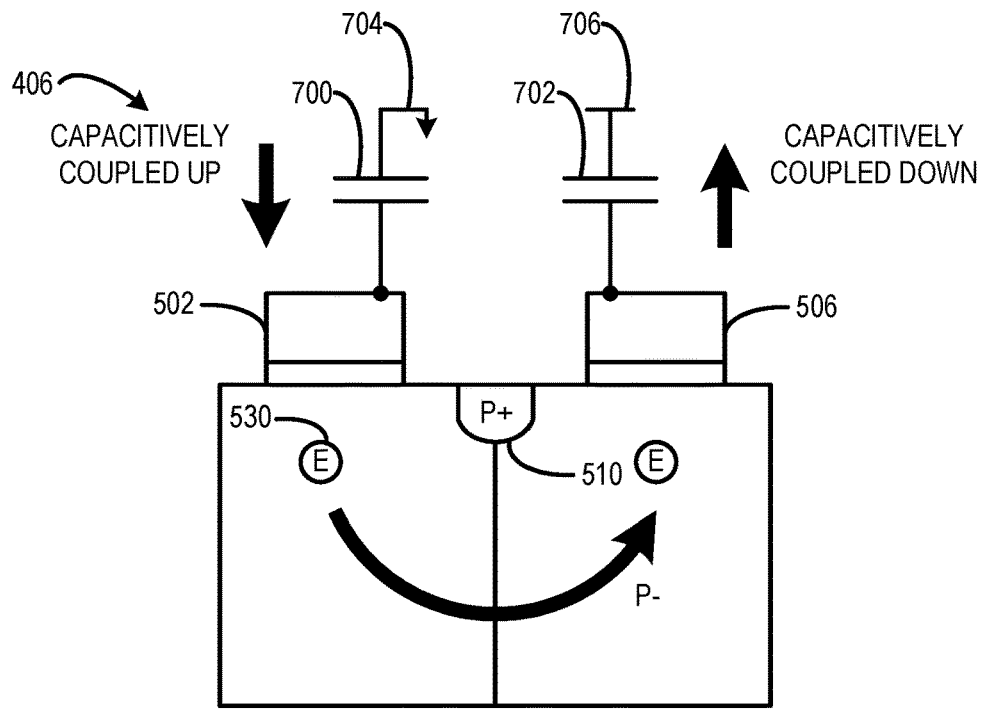
FIG. 7 shows an example implementation in which a nondestructive assessment of an amount of minority carrier photo charges is performed by a readout structure using capacitors.

In another example implementation shown in FIG. 7, the readout structure 406 includes a first capacitor 700 electronically coupled to the first gate 502 and a second capacitor 702 electronically coupled to the second gate 506. The readout structure 406 is configured to transfer the minority carrier photo charges 530 from being positioned under the first gate 502 to being positioned under the second gate 506 by capacitively coupling the first gate 502 to a low reference voltage 704 via the first capacitor 700 and capacitively coupling the second gate 506 to a high reference voltage 706 via the second capacitor 702. The low reference voltage 704 on the first gate 502 and the high reference voltage 706 on the second gate 512 repels the minority carrier photo charges 530 from being positioned under the first gate 502 and attracts the minority carrier photo charges 530 to being positioned under the second gate 506 with a level of attraction suitable to overcome the electrical barrier 510. Once the flipping operation is complete, the readout structure 406 measures the voltages on the first gate 502 and the second 506 with the minority carrier charges 530 positioned under the second gate 506. Voltages of the two gates 502, 506 (sampled via $V_{bitline1}$, $V_{bitline2}$) are sampled while the minority carrier charges 530 are positioned under the first 502 and then again while the minority carrier charges 530 are positioned under the second gate 506 to assess the amount of minority carrier photo charges for an assessment iteration. Note that the operations of moving the minority carrier photo charges is completely reversible and the minority carrier photo charges 530 can be placed back under the previous gate without destructively converting the minority carrier photo charges into majority carriers. Such nondestructive operations allow for repeated assessments of the amount of minority carrier photo charges for a plurality of assessment iterations.

The additional capacitors 700 and 702 may add extra capacitances to the readout structure 406 that lower a conversion gain of the readout signal relative to the configuration shown in FIG. 6. In order to avoid the extra capacitances, additional switches can be added to the readout structure 406 to allow the additional capacitors 700 and 702 to be selectively disconnected from the readout structure 406. However, the additional switches may create additional KT/C noise in the readout structure 406.

Figure 8:
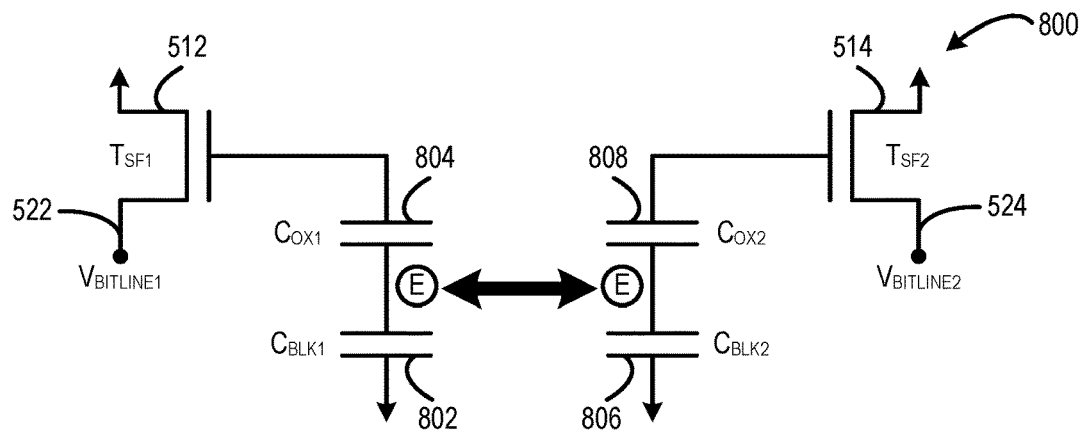
FIG. 8 shows an example lumped capacitor model of the readout structure shown in FIG. 5.

FIG. 8 shows a lumped capacitor model 800 of the readout structure 406 shown in FIG. 5 and corresponding equations that govern voltage on the two gates 502, 506 when the minority carrier photo charges 530 are alternated between being positioned under the two gates 502, 506. The lumped capacitor model 800 includes a plurality of capacitors representing capacitances of the readout structure 406. A capacitor ($C_{BLK1}$) 802 represents a capacitance of the minority carrier photo charges 530 in the substrate 500 under the first gate 502. A capacitor ($C_{OX1}$) 804 represents a capacitance of the first gate 502. A capacitor ($C_{SF1}$) represents a capacitance of the first source follower transistor 512. A capacitor ($C_{BLK2}$) 806 represents a capacitance of the photo charges in the substrate 500 under the second gate 506. A capacitor ($C_{OX2}$) 808 represents a capacitance of the second gate 506. A capacitor ($C_{SF2}$) represents a capacitance of the second source follower transistor 514.

The equations that govern the voltages on the two gates 502, 506 when the minority carrier photo charges are flipped include:

$$\Delta V_{BLK1} = \Delta Q / (C_{BLK1} + (C_{OX1} \perp C_{SF1})) \; \blacksquare$$

$$\Delta V_{VSF1} = \Delta Q / (C_{BLK1} + (C_{OX1} \perp C_{SF1})) * (C_{OX1}/(C_{SF1} + C_{OX1})) \; \diamond$$

$$\Delta V_{bitline} = 2 * \Delta Q / (C_{BLK1} + (C_{OX1} \perp C_{SF1})) * (C_{OX1}/(C_{SF1} + C_{OX1})) \; \blacksquare$$

■ TOP OF PLATE OF $C_{BLK1}$

◇: GATE OF $T_{SF1}$

■: $(V^0{}_{bitline1} - V_{bitline2}) - (V_{bitline1} - V^0{}_{bitline2})$

According to the above equations, the voltages $V_{bitline1}$ and $V_{bitline2}$ include KT/C noise due to the same reset of the two gates 502, 506 performed by the reset transistors 526, 528. However, $V^0{}_{bitline1}$ and $V_{bitline1}$ are derived after the same reset, so the same KT/C noise is present in both voltages. The same is true for $V^0{}_{bitline2}$ and $V_{bitline2}$. Thus, in both cases, the KT/C cancels out leaving the signal voltage $\Delta V_{bitline}$ without the KT/C noise.

According to the repeated and nondestructive assessment approach, the minority carrier photo charges are stored as minority carriers for an entire duration in which the readout structure 406 repeatedly and nondestructively assesses the amount of minority carrier photo charges 530 of the photodetector 402 for an integration period (by repeatedly measuring $\Delta V_{bitline}$). Note that the minority carrier charges are stored in the photodetector 402 until it is time for the particular row that includes the pixel 400 to be read out. Thus, in this case, the "entire duration" refers to duration of the readout of that pixel/row, and the plurality of assessment iterations of assessing the amount of minority carrier photo charges are performed during this duration.

The repeated and nondestructive assessment approach differs from other DCS-based measurement approaches that destructively convert the minority carrier photo charges into a voltage by transferring the photo charges into a floating diffusion and converting the photo charges into majority carriers. Such a DCS-based measurement approach that destructively converts the minority carrier photo charges into a voltage only allow for a single assessment iteration.

In contrast, by repeatedly and nondestructively assesses the amount of minority carrier photo charges 530 of the photodetector 402 for an integration period, the signal voltage $\Delta V_{bitline}$ is repeatedly read out and accumulated linearly with a number of assessment iterations (N). Noise is also accumulated during the plurality of assessment iterations, but the noise is increased by the square root of (N) based on the law of statistics. In other words, the signal is accumulated linearly, and the noise is accumulated sublinearly for the plurality of assessment iterations. Thus, by performing a plurality of assessment iterations, the SNR is increased through the process of statistical noise averaging. The readout structure 406 may be configured to perform any suitable number of assessment iterations to suitably increase the SNR. In some examples, the number of assessment iterations may be selected based on the speed at which the assessment iterations are performed to achieve a desired readout speed of the image sensor.

Figure 9:
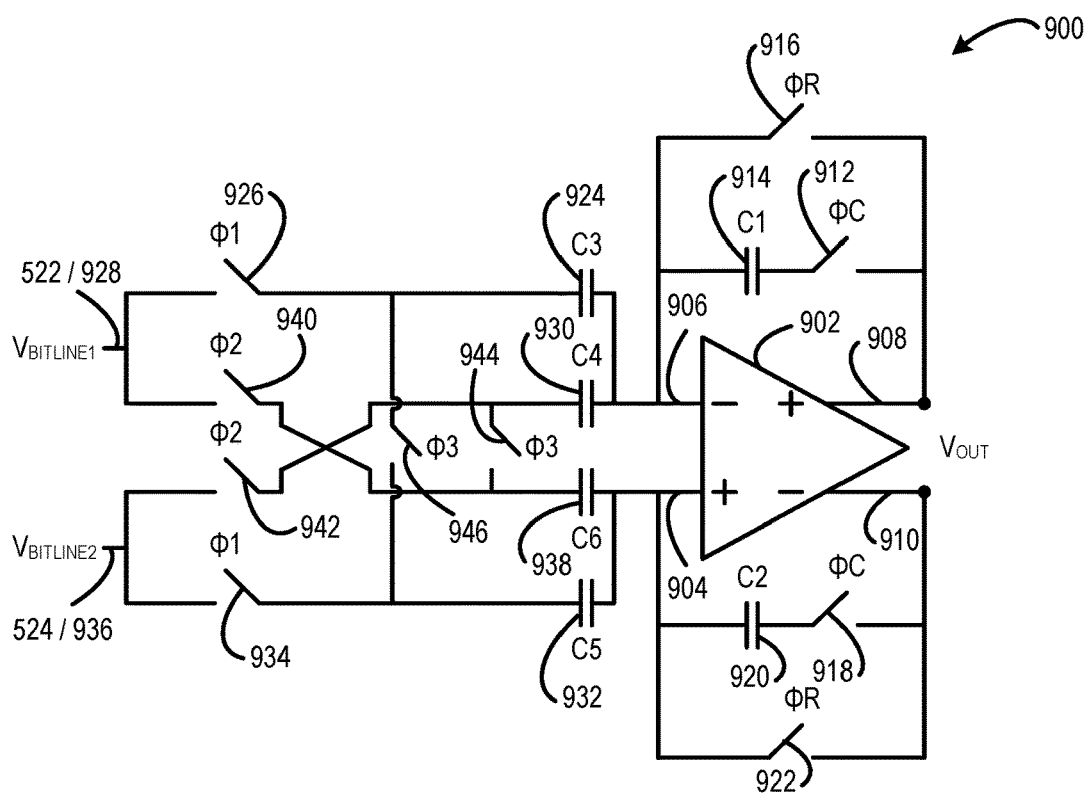
FIG. 9 shows an example column readout structure of an image sensor.

FIG. 9 shows an example column readout structure 900. For example, the column readout structure 900 may correspond to the column readout structure 308 shown in FIG. 3. The column readout structure 900 is configured to accumulate the repeated and nondestructive assessments of the amount of minority carrier photo charges accumulated in the photodetector 402 during the integration period. The column readout structure 900 electronically couples to the first bitline 522 and the second bitline 524 of the source followers 512, 514 shown in FIG. 5.

The column readout structure 900 includes an amplifier 902 including a positive input node 904, a negative input node 906, a positive output node 908, and a negative output node 910. A first switch (ΦC) 912 is electronically coupled to the positive output node 908 of the amplifier 902. A first capacitor ($C_1$) 914 is electronically coupled between the first switch 912 and the negative input node 906 of the amplifier 902. A second switch (ΦR) 916 is electronically coupled between the negative input node 906 of the amplifier 902 and the positive output node 908 of the amplifier 902. A third switch (ΦC) 918 is electronically coupled to the negative output node 910 of the amplifier 902. A second capacitor ($C_2$) 920 is electronically coupled between the third switch 918 and the positive input node 904 of the amplifier 902. A fourth switch (ΦR) 922 is electronically coupled between the positive input node 904 of the amplifier 902 and the negative output node 910 of the amplifier 902.

The column readout structure 900 includes a third capacitor ($C_3$) 924 electronically coupled to the negative input node 906 of the amplifier 902. A fifth switch (Φ1) 926 is electronically coupled between a first measurement input node ($V_{bitline1}$) 528/928 and the third capacitor 924. A fourth capacitor ($C_4$) 930 is electronically coupled to the negative input node 906 of the amplifier 902. A fifth capacitor ($C_5$) 935 is electronically coupled to the positive input node 904 of the amplifier 902. A sixth switch (Φ1) 934 is electronically coupled between a second measurement input node ($V_{bitline2}$) 530/936 and the fifth capacitor 932. A sixth capacitor ($C_6$) 938 is electronically coupled to the positive input node 904 of the amplifier 902. A seventh switch (Φ2) 940 is electronically coupled between the first measurement input node ($V_{bitline1}$) 528/928 and the sixth capacitor 938. An eighth switch (Φ2) 942 is electronically coupled between the second measurement input node ($V_{bitline2}$) 530/936 and the fourth capacitor 930. A nineth switch (Φ3) 944 is electronically coupled between the fourth capacitor 930 and the sixth capacitor 938. A tenth switch (Φ3) 946 is electronically coupled between the third capacitor 924 and the fifth capacitor 932.

During the plurality of assessment iterations performed by the readout structure 406 (shown in FIG. 5), the column readout structure 900 is configured to accumulate a commensurate charge on one or more capacitors (e.g., the first capacitor 914 and second capacitor 920) by performing a sequence of operations for each assessment iteration. At each assessment iteration, a commensurate charge corresponding to voltages ($\Delta V_{bitline}$) measured on the first and second bitlines 522, 524 is accumulated on the first and second capacitors 914, 920 faster than noise is accumulated on the first and second capacitors 914, 920, thereby statistically increasing the SNR of the signal corresponding to the amount of minority carrier photo charges accumulated in the photodetector for the integration period.

Figure 10:
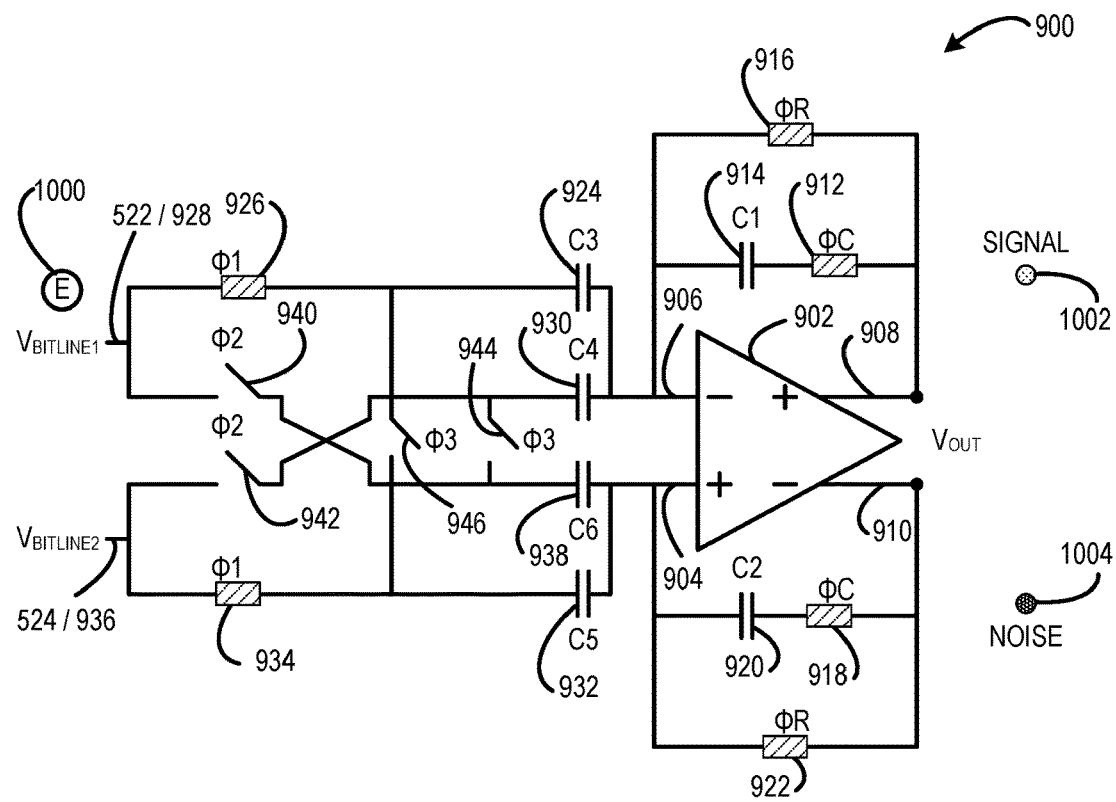
FIGS. 10-18 show an example sequence of operations that is performed by the column readout structure of FIG. 9.
Figure 11:
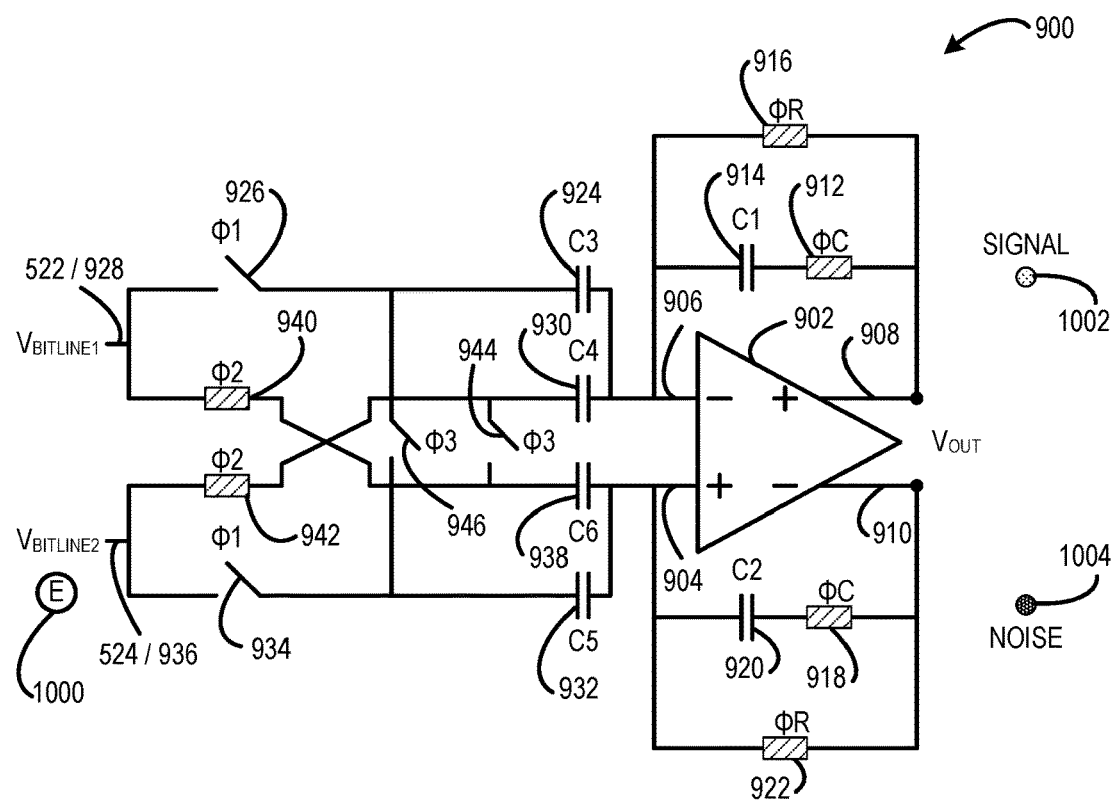
Figure 12:
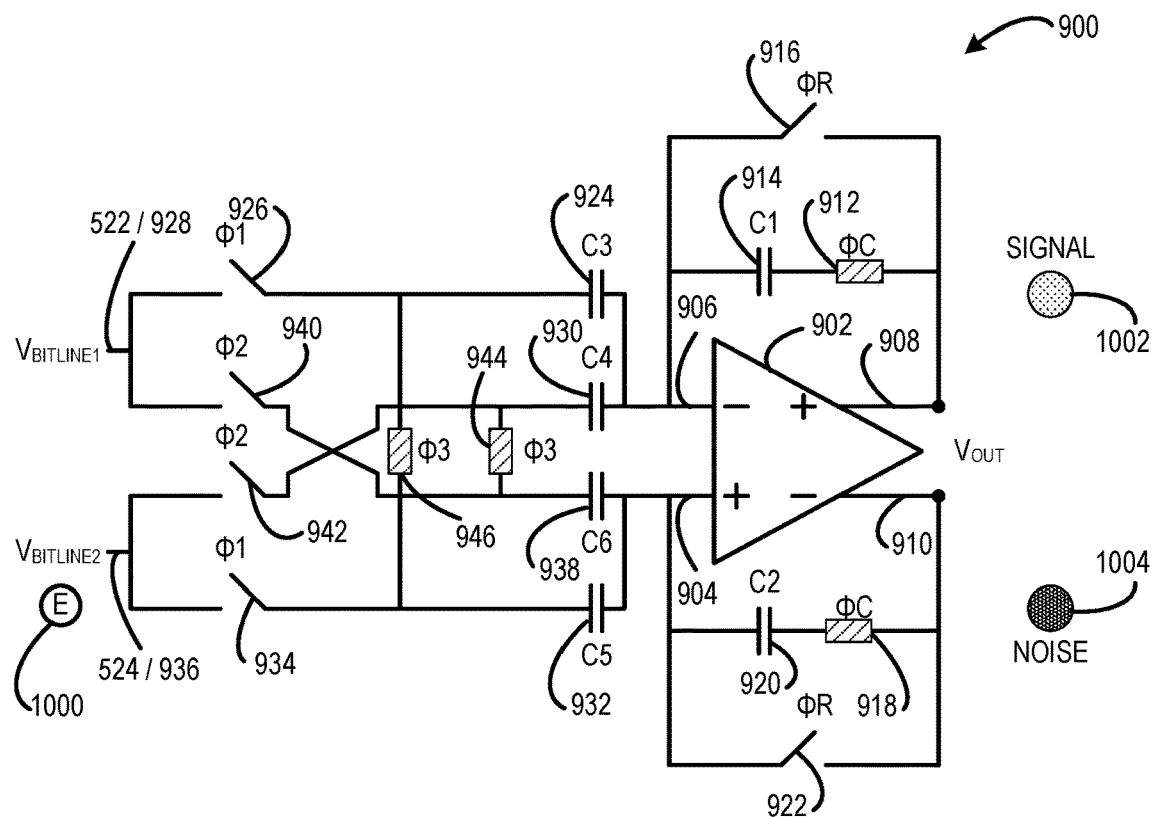
Figure 13:
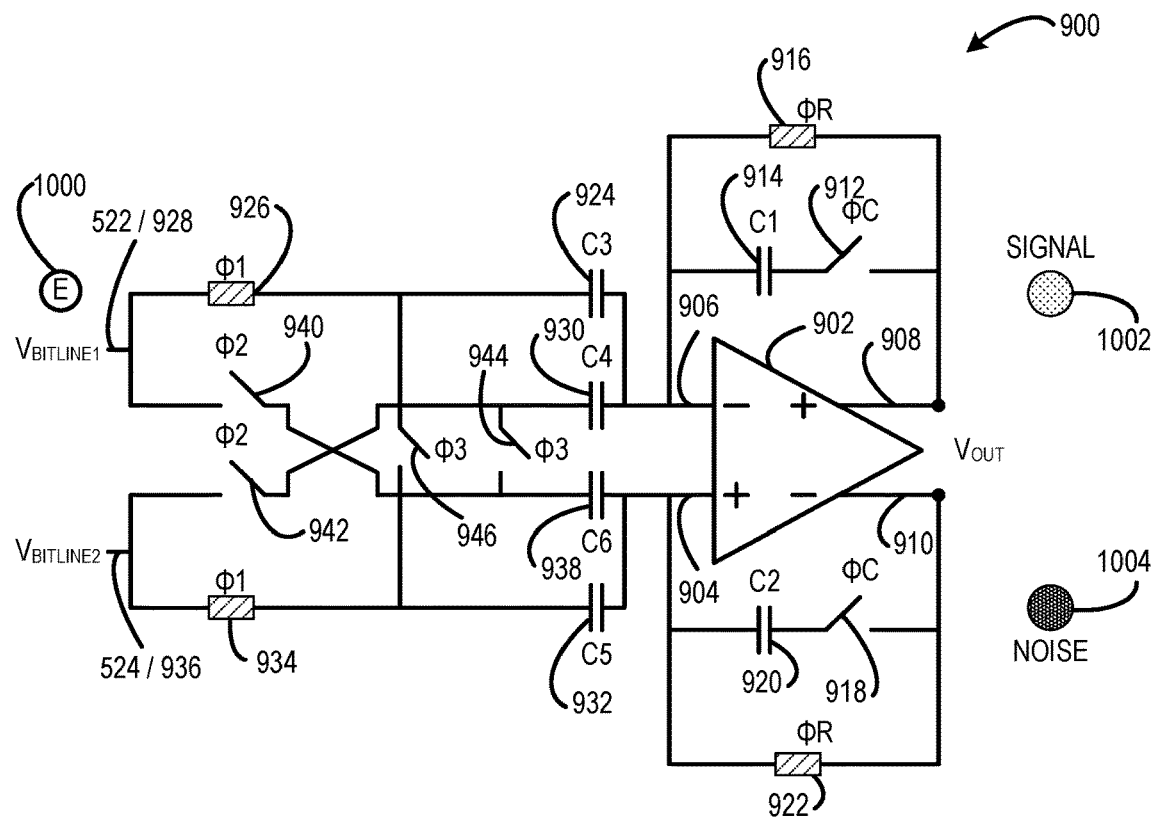
Figure 14:
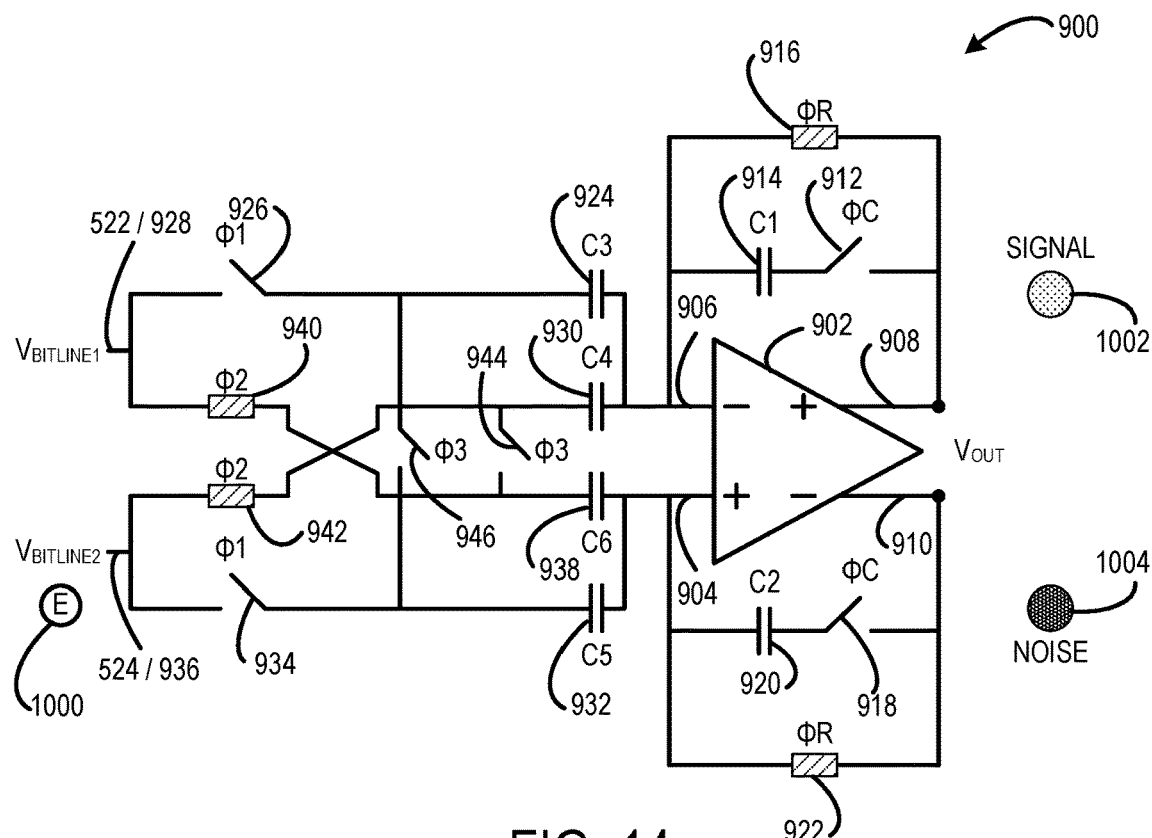
Figure 15:
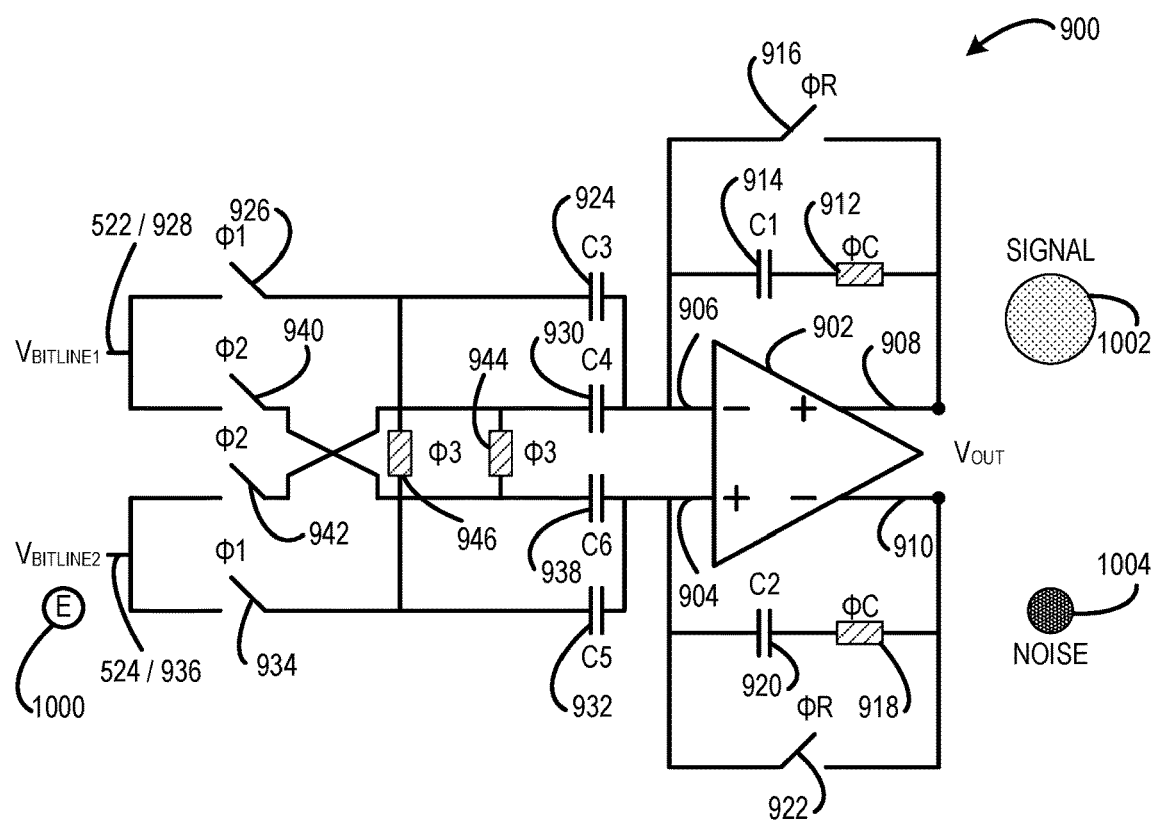
Figure 16:
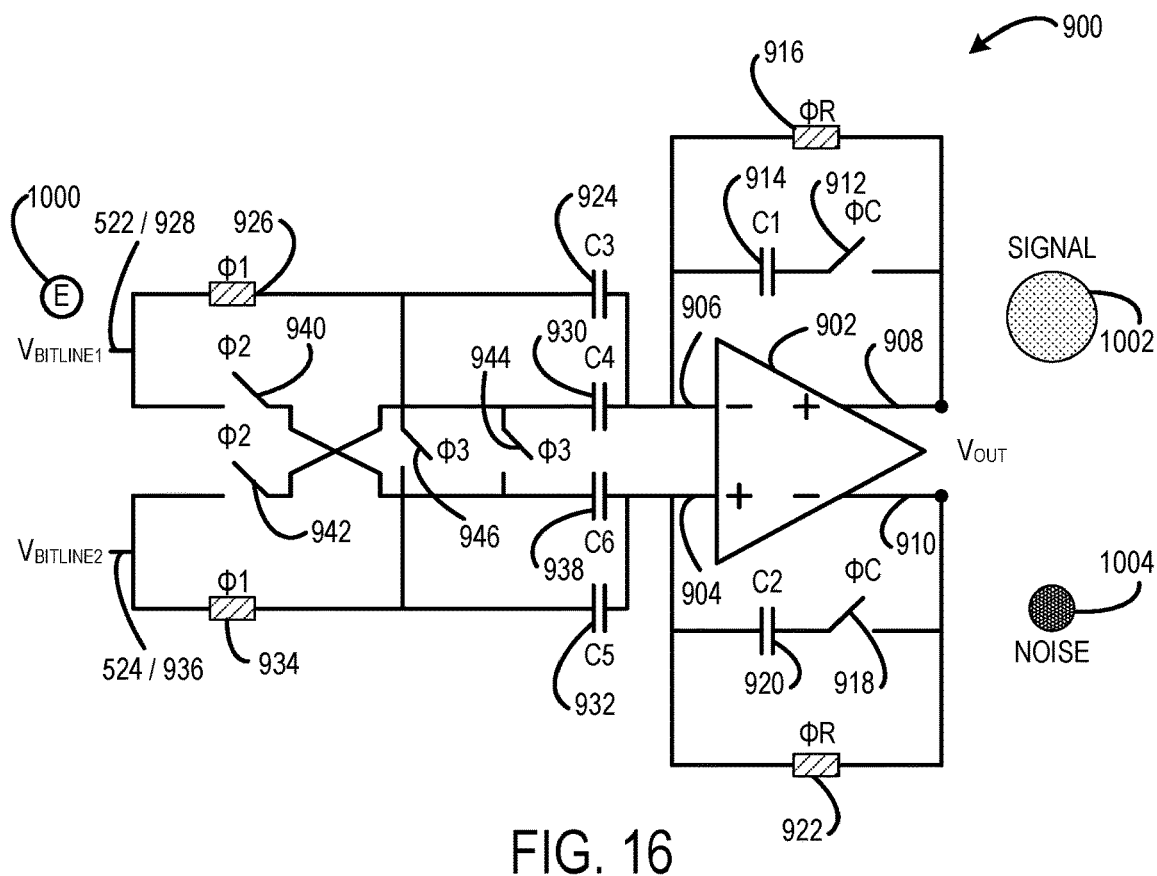
Figure 17:
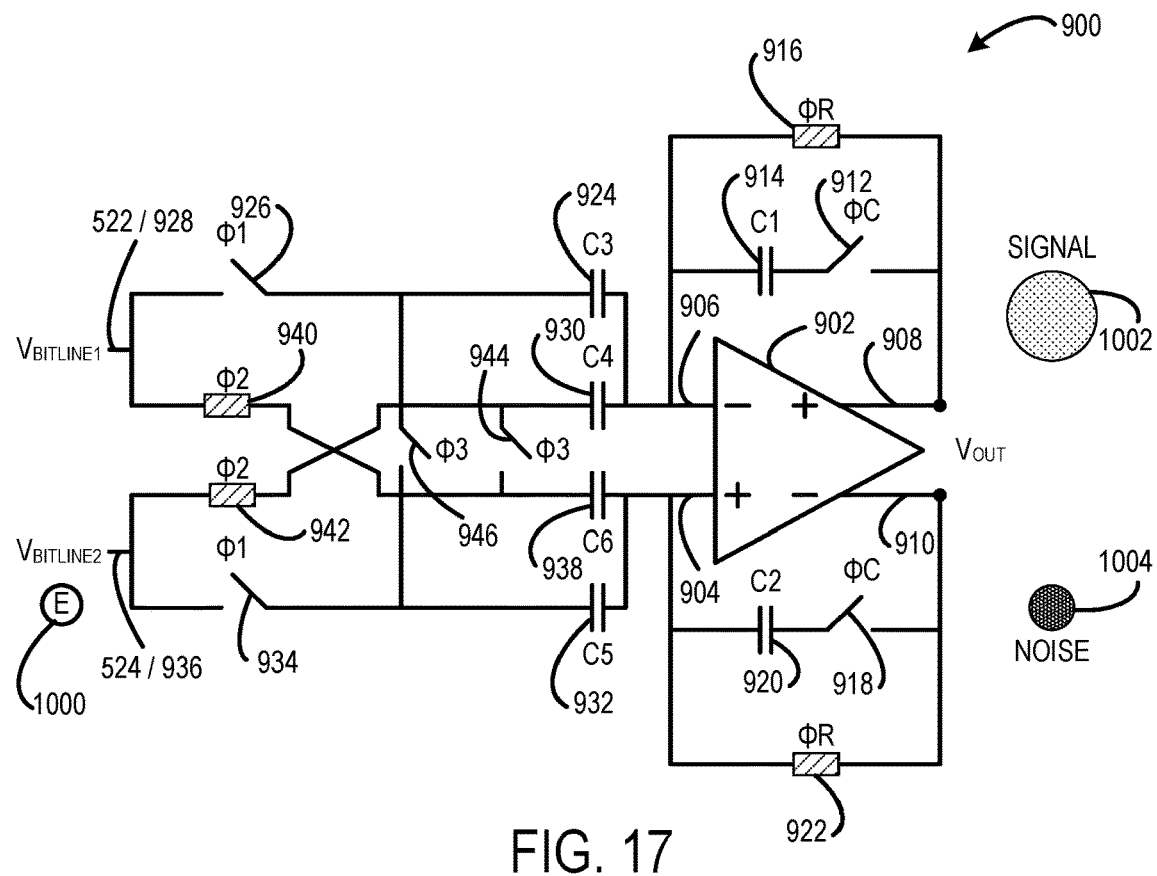
Figure 18:
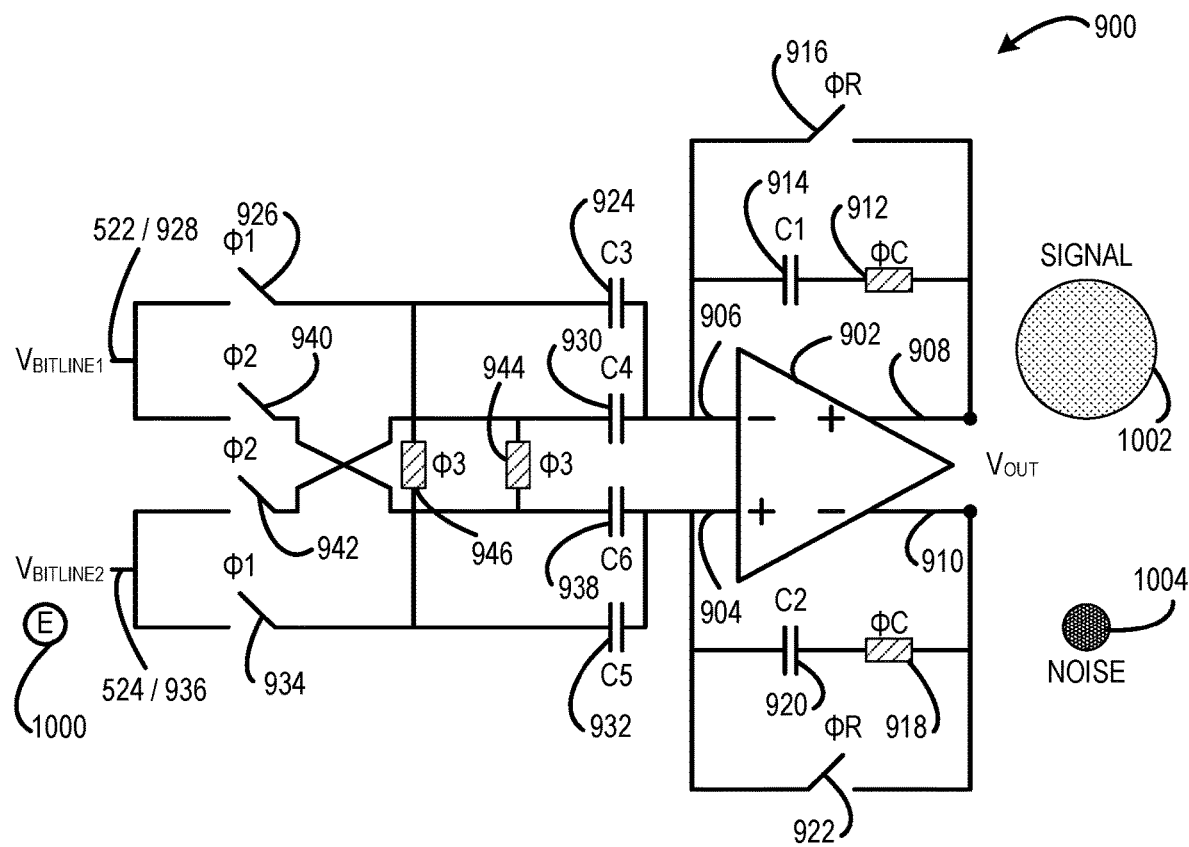

FIGS. 10-18 shows an example sequence of operation of the column readout structure 900 for three assessment iterations. Each assessment iteration includes three steps. A sequence of operation of the column readout structure 900 for the first assessment iteration is shown in FIGS. 10-12. A sequence of operation of the column readout structure 900 for the second assessment iteration is shown in FIGS. 13-15. A sequence of operation of the column readout structure 900 for the third assessment iteration is shown in FIGS. 16-18. In FIGS. 10-18 a first circle 1002 graphically represents how a signal level changes at each assessment iteration, and a second circle 1004 graphically represents how a noise level changes at each assessment iteration. These graphic representations are intended to show how the SNR changes across the plurality of assessment iterations. These graphic representations are meant to be non-limiting and are not intended to suggest anything about the absolute amount of signal or the absolute amount of noise.

In FIG. 10, the switches (ΦC) 912, 918 are turned on and the switches (ΦR) 916, 922 are turned on to reset the charge on the capacitors ($C_1$), ($C_2$) 914, 920, such that any prior accumulated charge is emptied. Signal 1002 and noise 1004 are minimal at this point. Further, minority carrier photo charges 1000 are associated with the first bitline 522/928 corresponding to the first gate 502 of the readout structure 406 (shown in FIG. 5). The switches (Φ1) 926, 934 are turned on/pulsed to push a commensurate charge from the first assessment iteration into the capacitors ($C_3$), ($C_6$) 924, 938. The remaining switches of the column readout structure 900 are turned off.

In FIG. 11, the switches (ΦC) 912, 918 and the switches (ΦR) 916, 922 remain turned on, and minority carrier photo charges 1000 are associated with the second bitline 530/936 corresponding to the second gate 506 of the readout structure 406 (shown in FIG. 5). The switches (Φ2) 940, 942 are turned on/pulsed to push the commensurate charge from the first assessment iteration into the capacitors ($C_4$), ($C_5$) 930, 932. The remaining switches of the column readout structure 900 are turned off.

In FIG. 12, the switches (ΦC) 912, 918 remain turned on. The switches (ΦR) 916, 922 are turned off. The switches (Φ3) 944, 946 are turned on/pulsed to push the commensurate charge accumulated in the capacitors ($C_3$), ($C_6$) 924, 938 and capacitors ($C_4$), ($C_5$) 930, 932 to the capacitors (C1), ($C_2$) 914, 920. The remaining switches of the column readout structure 900 are turned off. In some examples, the capacitances of the capacitors ($C_1$), ($C_2$) 914, 920 are less than the capacitances of the capacitors ($C_3$), ($C_4$), ($C_5$), ($C_6$) 924, 930, 932, 938, such that when the accumulated charge is pushed onto the capacitors ($C^1$), ($C_2$) 914, 920 the voltage is amplified. At the end of this first assessment iteration, the signal 1002 and noise 1004 are both amplified.

In FIG. 13, the second assessment iteration is initiated. The switches (ΦC) 912, 918 are turned off to preserve the charge accumulated on the capacitors ($C_1$), ($C_2$) 914, 920 from the first assessment iteration. The switches (ΦR) 916, 922 are turned on. The minority carrier photo charges 1000 are alternated back to being associated with the first bitline 522/928 corresponding to the first gate 502 of the readout structure 406 (shown in FIG. 5). The switches (Φ1) 926, 934 are turned on/pulsed to push the commensurate charge from the second assessment iteration into the capacitors ($C_3$), ($C_6$) 924, 938. The remaining switches of the column readout structure 900 are turned off.

In FIG. 14, the switches (ΦC) 912, 918 remain turned off. The switches (ΦR) 916, 922 remain turned on. The minority carrier photo charges 1000 are alternated to be associated with the second bitline 524/936 corresponding to the second gate 506 of the readout structure 406 (shown in FIG. 5). The switches (Φ2) 940, 942 are turned on/pulsed to push the commensurate charge from the second assessment iteration into the capacitors ($C_4$), ($C_5$) 930, 932. The remaining switches of the column readout structure 900 are turned off.

In FIG. 15, the switches (ΦC) 912, 918 are turned on. The switches (ΦR) 916, 922 are turned off. The switches (Φ3) 944, 946 are turned on/pulsed to push the commensurate charge accumulated on the capacitors ($C_3$), ($C_6$) 924, 938 and capacitors ($C_4$), ($C_5$) 930, 932 to the capacitors ($C_1$), ($C_2$) 914, 920. The remaining switches of the column readout structure 900 are turned off. At the end of this second assessment iteration, the signal 1002 and noise 1004 are both amplified again, however the charge is accumulated on the capacitors ($C_1$), ($C_2$) 914, 920 faster than noise is accumulated on the capacitors ($C_1$), ($C_2$) 914, 920, thereby statistically increasing the SNR of the signal.

In FIG. 16, the third assessment iteration is initiated. The switches (ΦC) 912, 918 are turned off to preserve the charge accumulated on the capacitors ($C_1$), ($C_2$) 914, 920 from the first and second assessment iterations. The switches (ΦR) 916, 922 are turned on. The minority carrier photo charges 1000 are alternated back to being associated with the first bitline 522/928 corresponding to the first gate 502 of the readout structure 406 (shown in FIG. 5). The switches (Φ1) 926, 934 are turned on/pulsed to push the commensurate charge from the third assessment iteration into the capacitors ($C_3$), ($C_6$) 924, 938. The remaining switches of the column readout structure 900 are turned off.

In FIG. 17, the switches (ΦC) 912, 918 remain turned off. The switches (ΦR) 916, 922 remain turned on. The minority carrier photo charges 1000 are alternated to be associated with on the second bitline 524/936 corresponding to the second gate 506 of the readout structure 406 (shown in FIG. 5). The switches (Φ2) 940, 942 are turned on/pulsed to push the commensurate charge from the third assessment iteration into the capacitors ($C_4$), ($C_5$) 930, 932. The remaining switches of the column readout structure 900 are turned off.

In FIG. 18, the switches (ΦC) 912, 918 are turned on. The switches (ΦR) 916, 922 are turned off. The switches (Φ3) 944, 946 are turned on/pulsed to push the commensurate charge accumulated on the capacitors ($C_3$), ($C_6$) 924, 938 and capacitors ($C_4$), ($C_5$) 930, 932 to the capacitors ($C_1$), ($C_2$) 914, 920. The remaining switches of the column readout structure 900 are turned off. At the end of this third assessment iteration, the signal 1002 and noise 1004 are both amplified again, however the charge is accumulated on the capacitors ($C_1$), ($C_2$) 914, 920 faster than noise is accumulated on the capacitors ($C_1$), ($C_2$) 914, 920, thereby statistically increasing the SNR of the signal.

The column readout structure 900 is configured to generate an output voltage ($V_{out}$) based on a commensurate charge accumulated on the capacitors ($C_1$), ($C_2$) 914, 920 for the plurality of assessment iterations (e.g., 3 assessment iterations in this example. The output voltage ($V_{out}$) may be commensurate with 2*N signal voltage ($\Delta V_{bitline}$), where N is the number of assessment iterations. The column readout structure 900 is configured such that the signal accumulates faster than the noise (e.g., N for signal vs square root of N for noise) for each assessment iteration.

The column readout structure 900 is provided as a non-limiting example. The repeated and nondestructive assessment approach described herein is broadly applicable to different circuit topologies including other column readout structures.

The repeated and nondestructive assessment approach is configured to reliably provide high SNR measurements of signals with read noise of 0.2e or lower which enables minimal false positives that enables reliable down to single photon counting based on the repeated and nondestructive measurement approach. Correspondingly, the repeated and nondestructive assessment approach enables an image sensor to generate high-fidelity low light images with minimal salting effects.

In some implementations, the readout structure 406 may have enhanced robustness and reliability by further lowering false positives of photon detection by adjusting a threshold trip point at which a first photon is deemed to be detected by the readout structure 406. In some examples, the readout structure 406 may be configured to measure an accumulation of photo charges on the photodetector 402 based on a threshold trip point that is greater than 0.5 electrons which is a typical trip point setting. In some examples, the trip point may be set at 0.7 electrons or 0.8 electrons. Such an increase in the trip point may slightly reduce a sensitivity of the image sensor while significantly reducing false positives. Further, in some examples, a noise standard deviation of a measured signal may be controlled in conjunction with the threshold trip point to further reduce false positives detected by the image sensor.

In another implementation, a readout structure of an image sensor is configured to employ a DCS structure with a floating diffusion in lieu of the approach employed by readout structure 406 (shown in FIG. 4). In this implementation, the readout structure is configured to perform a measurement averaging approach for both the $V_{reset}$ and $V_{reset+signal}$ quantities. First, the readout structure is configured to perform a plurality of reset voltage measurements to determine an average or preferably a best estimate of the reset voltage ($V_{reset}$) that would have existed immediately before transfer of minority carrier photo charges into the floating diffusion. Also, the readout structure is configured to perform a plurality of $V_{reset+signal}$ voltage measurements to determine an average or preferably a best estimate of the reset voltage ($V_{reset}$) that would have immediately after the transfer of minority carriers to the floating diffusion. The averaging method employed by the readout structure assumes zero-mean for all noise. However, flicker noise in source followers connecting to the bitlines may have low frequencies and hence may not have zero mean during the sampling period of both the $V_{reset}$ and $V_{reset+signal}$. In some examples, to improve on averaging, best estimates for both the $V_{reset}$ and $V_{reset+signal}$ voltages may incorporate a noise model for flicker noise or be extrapolated from curve fitting from the plurality of $V_{reset}$ and $V_{reset+signal}$ samples. In part because this flicker noise must be estimated (either analytically or though curve fitting), the readout structure produces lower noise signal estimates.

In an example, an image sensor comprises a photodetector configured to accumulate one or more minority carrier photo charges responsive to one or more incident photons during an integration period, and a readout structure electronically coupled to the photodetector and configured to repeatedly and nondestructively assess an amount of minority carrier photo charges accumulated at the photodetector during the integration period. In this example and/or other examples, the one or more minority carrier photo charges may be nondestructively stored at the readout structure for an entire duration in which the readout structure repeatedly and nondestructively assesses the amount of minority carrier photo charges accumulated at the photodetector. In this example and/or other examples, the readout structure may include two gates, and the readout structure may be configured to, prior to repeatedly and nondestructively assessing the amount of minority carrier photo charges, empty any prior charge accumulated under the two gates. In this example and/or other examples, the readout structure may include two gates, and the readout structure may be configured to, prior to repeatedly and nondestructively assessing the amount of minority carrier photo charges, initialize a voltage of each of the two gates to a reset voltage ($V_{reset}$). In this example and/or other examples, the readout structure may be configured to alternate the one or more minority carrier photo charges between the two gates for each nondestructive assessment of the amount of minority carrier photo charges. In this example and/or other examples, the readout structure may include a first source follower electronically coupled to a first gate of the two gates and a second source follower electronically coupled to a second gate of the two gates, the readout structure may be configured to transfer the one or more minority carrier photo charges from under the first gate to under the second gate by capacitively coupling the first gate to a reference low voltage via the first source follower and capacitively coupling the second gate to a reference high voltage via the second source follower. In this example and/or other examples, the readout structure may include a first capacitor electronically coupled to a first gate of the two gates and a second capacitor electronically coupled to a second gate of the two gates, the readout structure may be configured to transfer the one or more minority carrier photo charges from under the first gate to under the second gate by capacitively coupling the first gate to a reference low voltage via the first capacitor and capacitively coupling the second gate to a reference high voltage via the second capacitor. In this example and/or other examples, the image sensor may further comprise a column readout structure electronically coupled to the readout structure, each time the amount of minority carrier photo charges may be nondestructively assessed for an assessment iteration a commensurate charge is accumulated on one or more capacitors of the column readout structure. In this example and/or other examples, the column readout structure may be configured to generate an output voltage ($V_{out}$) based on a commensurate charge accumulated on the one or more capacitors of the column readout structure for a plurality of assessment iterations. In this example and/or other examples, the commensurate charge may be accumulated on the one or more capacitors faster than noise is accumulated on the one or more capacitors for the plurality of assessment iterations, thereby statistically increasing a signal to noise ratio of a signal corresponding to the amount of minority carrier photo charges accumulated at the photodetector during the integration period. In this example and/or other examples, the column readout structure may include a plurality of capacitors, and the commensurate charge may be distributed between the plurality of capacitors. In this example and/or other examples, the column readout structure may include an amplifier including a positive input node, a negative input node, a positive output node, and a negative output node, a first switch electronically coupled to the positive output node of the amplifier, the capacitor may be a first capacitor electronically coupled between the first switch and the negative input node of the amplifier, a second switch electronically coupled between the negative input node of the amplifier and the positive output node of the amplifier, a third switch electronically coupled to the negative output node of the amplifier, a second capacitor electronically coupled between the third switch and the positive input node of the amplifier, a fourth switch electronically coupled between the positive input node of the amplifier and the negative output node of the amplifier, a third capacitor electronically coupled to the negative input node of the amplifier, a fifth switch electronically coupled between a first measurement input node and the third capacitor, a fourth capacitor electronically coupled to the negative input node of the amplifier, a fifth capacitor electronically coupled to the positive input node of the amplifier, a sixth switch electronically coupled between a second measurement input node and the fifth capacitor, a sixth capacitor electronically coupled to the positive input node of the amplifier, a seventh switch electronically coupled between the first measurement input node and the sixth capacitor, an eighth switch electronically coupled between the second measurement input node and the fourth capacitor, a ninth switch electronically coupled between the fourth capacitor and the sixth capacitor, and a tenth switch electronically coupled between the third capacitor and the fifth capacitor. In this example and/or other examples, the readout structure may be configured to assess the amount of minority carrier photo charges accumulated at the photodetector during the integration period based on a threshold trip point for detecting an electron that is greater than 0.5 electrons.

In another example, an image sensor comprises a photodetector configured to accumulate one or more minority carrier photo charges responsive to one or more incident photons during an integration period, a readout structure electronically coupled to the photodetector and configured to repeatedly and nondestructively assess an amount of minority carrier photo charges accumulated at the photodetector for the integration period, and a column readout structure electronically coupled to the readout structure and including one or more capacitors, wherein each time the amount of minority carrier photo charges is nondestructively assessed by the readout structure a commensurate charge is accumulated on the one or more capacitors faster than noise is accumulated on the one or more capacitors. In this example and/or other examples, the one or more minority carrier photo charges may be nondestructively stored at the readout structure for an entire duration in which the readout structure repeatedly and nondestructively assesses the amount of minority carrier photo charges accumulated at the photodetector. In this example and/or other examples, the readout structure may include two gates, and the readout structure may be configured to, prior to repeatedly and nondestructively assessing the amount of minority carrier photo charges, empty any prior charge accumulated under the two gates. In this example and/or other examples, the readout structure may include two gates, and the readout structure may be configured to, prior to repeatedly and nondestructively assessing the amount of minority carrier photo charges, initialize a voltage of each of the two gates to a reset voltage ($V_{reset}$). In this example and/or other examples, the readout structure may be configured to alternate the one or more minority carrier photo charges between the two gates for each nondestructive assessment of the amount of minority carrier photo charges. In this example and/or other examples, the column readout structure may be configured to generate an output voltage ($V_{out}$) based on a commensurate charge accumulated on the one or more capacitors for a plurality of assessment iterations.

In yet another example, an image sensor comprises a photodetector configured to accumulate one or more minority carrier photo charges responsive to one or more incident photons during an integration period, and a readout structure electronically coupled to the photodetector, the readout structure including a first gate, a second gate, a first source follower electronically coupled to the first gate, and a second source follower electronically coupled to the second gate, wherein the readout structure alternates the one or more photo charges between the first gate and the second gate for each of a plurality of nondestructive minority carrier photo charge assessments during the integration period.

No aspect of the foregoing drawings or description should be understood in a limiting sense, for numerous variations, extensions, and omissions are also envisaged. It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An image sensor comprising:
   a photodetector configured to accumulate one or more minority carrier photo charges responsive to one or more incident photons during an integration period; and
   a readout structure electronically coupled to the photodetector and configured to repeatedly and nondestructively assess an amount of minority carrier photo charges accumulated at the photodetector during the integration period, wherein the readout structure includes two gates, wherein the readout structure is configured to, prior to repeatedly and nondestructively assessing the amount of minority carrier photo charges, initialize a voltage of each of the two gates to a reset voltage ($V_{reset}$), wherein the readout structure is configured to alternate the one or more minority carrier photo charges between the two gates for each nondestructive assessment of the amount of minority carrier photo charges, wherein the readout structure includes a first source follower electronically coupled to a first gate of the two gates and a second source follower electronically coupled to a second gate of the two gates, wherein the readout structure is configured to transfer the one or more minority carrier photo charges from under the first gate to under the second gate by capacitively coupling the first gate to a reference low voltage via the first source follower and capacitively coupling the second gate to a reference high voltage via the second source follower.

2. The image sensor of claim 1, wherein the one or more minority carrier photo charges are nondestructively stored at the readout structure for an entire duration in which the readout structure repeatedly and nondestructively assesses the amount of minority carrier photo charges accumulated at the photodetector.

3. The image sensor of claim 1, wherein the readout structure is configured to, prior to repeatedly and nondestructively assessing the amount of minority carrier photo charges, empty any prior charge accumulated under the two gates.

4. The image sensor of claim 1, further comprising a column readout structure electronically coupled to the readout structure, wherein each time the amount of minority carrier photo charges is nondestructively assessed for an assessment iteration a commensurate charge is accumulated on one or more capacitors of the column readout structure.

5. The image sensor of claim 4, wherein the column readout structure is configured to generate an output voltage ($V_{out}$) based on a commensurate charge accumulated on the one or more capacitors of the column readout structure for a plurality of assessment iterations.

6. The image sensor of claim 5, wherein the commensurate charge is accumulated on the one or more capacitors faster than noise is accumulated on the one or more capacitors for the plurality of assessment iterations, thereby statistically increasing a signal to noise ratio of a signal corresponding to the amount of minority carrier photo charges accumulated at the photodetector during the integration period.

7. The image sensor of claim 6, wherein the column readout structure includes a plurality of capacitors, and wherein the commensurate charge is distributed between the plurality of capacitors.

8. The image sensor of claim 5, wherein the column readout structure includes:
   an amplifier including a positive input node, a negative input node, a positive output node, and a negative output node;
   a first switch electronically coupled to the positive output node of the amplifier, wherein the capacitor is a first capacitor electronically coupled between the first switch and the negative input node of the amplifier;
   a second switch electronically coupled between the negative input node of the amplifier and the positive output node of the amplifier;
   a third switch electronically coupled to the negative output node of the amplifier,
   a second capacitor electronically coupled between the third switch and the positive input node of the amplifier;
   a fourth switch electronically coupled between the positive input node of the amplifier and the negative output node of the amplifier;
   a third capacitor electronically coupled to the negative input node of the amplifier;
   a fifth switch electronically coupled between a first measurement input node and the third capacitor;
   a fourth capacitor electronically coupled to the negative input node of the amplifier;
   a fifth capacitor electronically coupled to the positive input node of the amplifier;
   a sixth switch electronically coupled between a second measurement input node and the fifth capacitor;
   a sixth capacitor electronically coupled to the positive input node of the amplifier;
   a seventh switch electronically coupled between the first measurement input node and the sixth capacitor;
   an eighth switch electronically coupled between the second measurement input node and the fourth capacitor;
   a ninth switch electronically coupled between the fourth capacitor and the sixth capacitor; and
   a tenth switch electronically coupled between the third capacitor and the fifth capacitor.

9. The image sensor of claim 1, where the readout structure is configured to assess the amount of minority carrier photo charges accumulated at the photodetector during the integration period based on a threshold trip point for detecting an electron that is greater than 0.5 electrons.

10. An image sensor comprising:
    a photodetector configured to accumulate one or more minority carrier photo charges responsive to one or more incident photons during an integration period;
    a readout structure electronically coupled to the photodetector and including two gates, wherein the readout structure is configured to repeatedly and nondestructively assess an amount of minority carrier photo charges accumulated at the photodetector for the integration period, and wherein the readout structure is configured to alternate the one or more minority carrier photo charges between the two gates for each nondestructive assessment of the amount of minority carrier photo charges; and a column readout structure electronically coupled to the readout structure and including one or more capacitors, wherein each time the amount of minority carrier photo charges is nondestructively assessed by the readout structure a commensurate charge is accumulated on the one or more capacitors faster than noise is accumulated on the one or more capacitors.

11. The image sensor of claim 10, wherein the one or more minority carrier photo charges are nondestructively stored at the readout structure for an entire duration in which the readout structure repeatedly and nondestructively assesses the amount of minority carrier photo charges accumulated at the photodetector.

12. The image sensor of claim 10, wherein the readout structure is configured to, prior to repeatedly and nondestructively assessing the amount of minority carrier photo charges, empty any prior charge accumulated under the two gates.

13. The image sensor of claim 10, wherein the readout structure is configured to, prior to repeatedly and nondestructively assessing the amount of minority carrier photo charges, initialize a voltage of each of the two gates to a reset voltage ($V_{reset}$).

14. The image sensor of claim 10, wherein the column readout structure is configured to generate an output voltage ($V_{out}$) based on a commensurate charge accumulated on the one or more capacitors for a plurality of assessment iterations.

15. An image sensor comprising:
a photodetector configured to accumulate one or more minority carrier photo charges responsive to one or more incident photons during an integration period; and
a readout structure electronically coupled to the photodetector, the readout structure including:
a first gate,
a second gate,
a first source follower electronically coupled to the first gate, and
a second source follower electronically coupled to the second gate,
wherein the readout structure is configured to repeatedly and nondestructively assess an amount of minority carrier photo charges accumulated at the photodetector for the integration period, and wherein the readout structure is configured to alternate the one or more photo charges between the first gate and the second gate for each of a plurality of nondestructive minority carrier photo charge assessments during the integration period by capacitively coupling the first gate to either a first reference voltage or a second reference voltage via the first source follower and capacitively coupling the second gate to the other of the first reference voltage or the second reference voltage via the second source follower.

* * * * *